US012805365B2

(12) United States Patent
Maeda et al.

(10) Patent No.: US 12,805,365 B2
(45) Date of Patent: Nov. 17, 2026

(54) SEMICONDUCTOR DEVICE AND METHOD OF MANUFACTURING SEMICONDUCTOR DEVICE

(71) Applicant: Kioxia Corporation, Tokyo (JP)

(72) Inventors: Takeori Maeda, Mie (JP); Tetsuya Kurosawa, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 465 days.

(21) Appl. No.: 18/463,807

(22) Filed: Sep. 8, 2023

(65) Prior Publication Data

US 2024/0087970 A1 Mar. 14, 2024

(30) Foreign Application Priority Data

Sep. 12, 2022 (JP) ................................ 2022-144507

(51) Int. Cl.
*H01L 23/14* (2006.01)
*H10P 72/70* (2026.01)
(Continued)

(52) U.S. Cl.
CPC ..... *H10W 70/6875* (2026.01); *H10P 72/7402* (2026.01); *H10W 70/611* (2026.01);
(Continued)

(58) Field of Classification Search
CPC ... H01L 23/142; H01L 21/52; H01L 21/6836; H01L 23/10; H01L 23/5384; H10W 90/00; H10W 90/297; H10W 90/752; H10W 90/754; H10W 70/6875; H10W 70/611; H10W 70/635; H10W 72/071; H10W 76/60; H10P 72/7402
See application file for complete search history.

(56) References Cited

U.S. PATENT DOCUMENTS

| | | | | |
|---|---|---|---|---|
| 5,714,800 A * | 2/1998 | Thompson | .......... | H10W 70/635 257/E23.14 |
| 9,048,222 B2 * | 6/2015 | Hung | ..................... | H10D 84/01 |

(Continued)

FOREIGN PATENT DOCUMENTS

| | | |
|---|---|---|
| CN | 113196895 A | 7/2021 |
| JP | 2005-032820 A | 2/2005 |
| JP | 5275192 B2 | 8/2013 |

*Primary Examiner* — Jarrett J Stark
(74) *Attorney, Agent, or Firm* — Oblon, McClelland, Maier & Neustadt, L.L.P.

(57) ABSTRACT

According to one embodiment, a semiconductor device includes a wiring board, an adhesive, a semiconductor module, and a sealing member. The wiring board includes a step at an outer peripheral. The adhesive is provided on the wiring board. The semiconductor module is disposed on the adhesive. The semiconductor module is mounted inward from the step of the wiring board. The sealing member covers the step, a side surface of the adhesive, and the semiconductor module. The step includes a side surface and a bottom surface. The side surface faces an outside of the wiring board. The bottom surface extends from a lower end of the side surface toward an end part of the wiring board. The side surface of the step and the side surface of the adhesive are positioned to overlap with one another in a view from a stacking direction of the adhesive and the semiconductor module.

12 Claims, 11 Drawing Sheets

(51) Int. Cl.
*H10W 70/60* (2026.01)
*H10W 70/63* (2026.01)
*H10W 70/68* (2026.01)
*H10W 72/00* (2026.01)
*H10W 76/60* (2026.01)

(52) U.S. Cl.
CPC ....... *H10W 70/635* (2026.01); *H10W 72/071* (2026.01); *H10W 76/60* (2026.01)

(56) References Cited

U.S. PATENT DOCUMENTS 12,119,324 B2 * 10/2024 Yeh ......................... H10P 72/74
2002/0050642 A1 * 5/2002 Oota ................... H10P 72/7402 257/784
2004/0232566 A1 * 11/2004 Mita ................... H10W 74/114 257/E23.125
2010/0122838 A1 * 5/2010 Asami .................. H05K 1/0203 174/255
2011/0074017 A1 3/2011 Morifuji et al.
2011/0316172 A1 * 12/2011 Igarashi ................ H10W 70/60 257/777
2012/0015687 A1 * 1/2012 Yamada ................ H10W 42/20 257/659
2012/0228749 A1 * 9/2012 Pagaila ................. H10W 70/65 257/659
2014/0183755 A1 * 7/2014 Huang .................. H10W 42/20 257/774
2014/0220740 A1 8/2014 Morifuji et al.
2016/0211198 A1 7/2016 Yamagami et al.
2018/0166490 A1 * 6/2018 Wakiyama ............ H10F 39/809
2018/0166491 A1 6/2018 Nagata et al.
2018/0247893 A1 8/2018 Kayashima et al.
2018/0269181 A1 * 9/2018 Yang ................... H10W 74/016
2018/0286816 A1 * 10/2018 Kitazaki ............... H10W 42/20
2019/0244907 A1 * 8/2019 Liao .................... H10W 70/614
2020/0066701 A1 * 2/2020 Guo ...................... H10W 90/00
2020/0105715 A1 * 4/2020 Jang .................... H10P 72/7402
2021/0035895 A1 * 2/2021 Oh ...................... H10W 74/117
2021/0225727 A1 * 7/2021 Chen ..................... H10W 40/22
2022/0005779 A1 * 1/2022 Niwa .................. H10W 70/685
2022/0310411 A1 * 9/2022 Chen ................... H10W 74/014
2023/0369283 A1 * 11/2023 Chen ................... H10P 72/0438
2024/0030076 A1 * 1/2024 Lin ......................... H10P 72/74
2024/0113002 A1 * 4/2024 Huang ................ H10W 70/685
2026/0033370 A1 * 1/2026 Ye ......................... H10W 70/68

* cited by examiner

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from Japanese Patent Application No. 2022-144507, filed on Sep. 12, 2022, the entire contents of which are incorporated herein by reference.

FIELD

Embodiments described herein relate generally to a semiconductor device and a method of manufacturing the semiconductor device.

BACKGROUND

Conventionally, there has been a semiconductor device including a module in which a semiconductor chip is molded. The module is diced by dicing while being connected onto a wiring board via a solder ball. There is a case that an adhesive is injected between the module and the wiring board.

At the time of the injection, the adhesive may protrude from an end part of the module. Therefore, when performing the dicing, the protruding adhesive is exposed on an end surface of the semiconductor device, and thereby the flame retardancy and moisture absorption reflowability of the semiconductor device may be deteriorated.

DETAILED DESCRIPTION

According to one embodiment, a semiconductor device includes a wiring board, an adhesive, a semiconductor module, and a sealing member. The wiring board includes a step located at an outer peripheral part of the wiring board. The adhesive is provided on a surface of the wiring board. The semiconductor module is disposed on an upper surface of the adhesive. The semiconductor module is mounted inward from the step of the wiring board. The sealing member covers the step, a side surface of the adhesive, and the semiconductor module. The step includes a side surface and a bottom surface. The side surface faces an outside of the wiring board. The bottom surface extends from a lower end of the side surface toward an end part of the wiring board. The side surface of the step and the side surface of the adhesive are positioned to overlap with one another in a view from a stacking direction of the adhesive and the semiconductor module.

Hereinafter, a semiconductor device and a method of manufacturing the semiconductor device according to embodiments will be described in detail with reference to the accompanying drawings. Note that the present invention is not limited by these embodiments.

First Embodiment

Hereinafter, a first embodiment will be described in detail with reference to FIGS. 1 to 8B.

Configuration Example of Semiconductor Device

Figure 1:
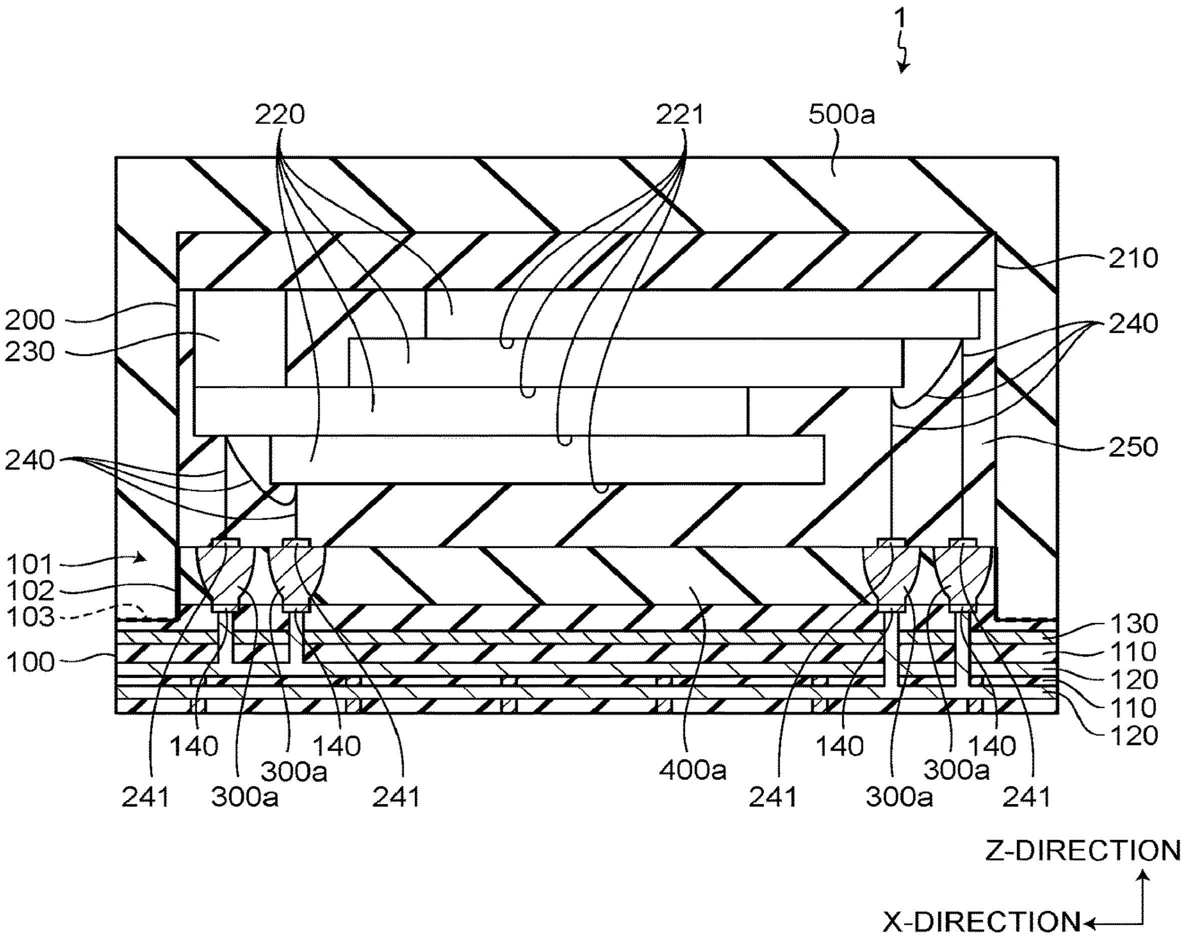
FIG. 1 is a diagram illustrating an example of a configuration of a semiconductor device according to a first embodiment.

FIG. 1 is a diagram illustrating an example of a configuration of a semiconductor device 1 according to the first embodiment. FIG. 1 is an XZ cross-sectional view of the semiconductor device 1.

Note that, in the present specification, a side of a support 210 of the semiconductor device 1 is defined as an upper side, and a side of a printed wiring board 100 of the semiconductor device 1 is defined as a lower side. In addition, a vertical direction of the semiconductor device 1 is referred to as a stacking direction along a Z-direction. In addition, an X-direction is a direction along a direction of a surface of the printed wiring board 100 to be described later, and the X-direction and the Z-direction are directions orthogonal to each other. In addition, a direction indicated by an arrow of a Z-axis is defined as a positive direction of Z, and a direction opposite to the arrow of the Z-axis is defined as a negative direction of Z.

As illustrated in FIG. 1, the semiconductor device 1 is configured as, for example, a package in which one or more semiconductor chips 220 are sealed, and includes the printed wiring board 100, a module 200, solder balls 300*a*, an adhesive 400*a*, and a sealing member 500*a*. The module 200 is disposed above the surface of the printed wiring board 100. The solder balls 300*a* are disposed between an upper surface of the printed wiring board 100 and a lower surface of the module 200, and the printed wiring board 100 and the module 200 are electrically connected via the solder balls 300*a*. The adhesive 400*a* is injected between the solder balls

300*a*. In addition, the printed wiring board 100, the adhesive 400*a*, and the module 200 are covered with the sealing member 500*a*.

The printed wiring board (printed circuit board: PCB) 100 as a wiring board is configured as, for example, a multilayer board formed by alternately stacking insulating layers 110 and conductive layers 120 multiple times. In addition, the printed wiring board 100 includes a ground wire 130 and electrodes 140.

The insulating layer 110 is made of, for example, a carbon fiber, a glass fiber, an aramid fiber, etc. impregnated with a thermosetting resin such as an epoxy resin before curing.

The conductive layer 120 as wiring is made of metal such as Cu. The ground wire 130 and the electrode 140 are also made of metal such as Cu. The conductive layer 120 has a wiring pattern and is connected to the electrodes 140 on the upper surface of the printed wiring board 100. The electrode 140 is electrically connected to the solder ball 300*a*. An electrode (not illustrated) disposed on a lower surface of the printed wiring board 100 is electrically connected to a host computer or the like via a motherboard or the like. A ground potential is applied to the ground wire 130.

The printed wiring board 100 has, for example, a rectangular shape in a view in the Z-direction. An outer peripheral part of the printed wiring board 100 is dug down to a predetermined position toward the negative direction of Z. With this configuration, a step 101 including a side surface 102 and a bottom surface 103 is provided on the surface of the printed wiring board 100.

The side surface 102 of the step 101 is a surface of the printed wiring board 100 facing the outside, and the bottom surface 103 is a surface extending from a lower end of the side surface 102 toward an end part of the printed wiring board 100.

A surface of the bottom surface 103 may be roughened when the step 101 is formed, as compared with, for example, a mounting surface of the printed wiring board 100.

The module 200 as a semiconductor module includes the support 210, the plurality of semiconductor chips 220, a pedestal 230, wires 240, and a molding material 250.

The support 210 is a plate-like member that supports the plurality of semiconductor chips 220 stacked. The support 210 includes a printed wiring board having dummy wiring (not illustrated), that is, an insulating layer made of an epoxy resin or the like, and a metal layer. As described above, the support 210 and the printed wiring board 100 have similar configurations, so that the support 210 and the printed wiring board 100 have substantially equal coefficients of thermal expansion. The support 210 and the printed wiring board 100 disposed opposite to each other in the Z-direction have substantially equal coefficients of thermal expansion, so that stress due to expansion and contraction of the support 210 and the printed wiring board 100 is suppressed. As a result, warpage or the like of the semiconductor device 1 is suppressed. The support 210 may be a lead frame, a chip, or a ceramic in addition to a printed wiring board.

Each of the semiconductor chips 220 is a small piece obtained by dicing a Si substrate or the like, and includes a semiconductor element (not illustrated) on a surface on a main surface 221 side. The semiconductor chips 220 are sequentially stacked toward the negative direction of Z with the main surfaces 221 facing the printed wiring board 100 side while being shifted from each other in the X-direction.

More specifically, the first one of the semiconductor chips 220 is disposed so as to contact with the support 210. The second one of the semiconductor chips 220 contacts with the main surface 211 of the first one of the semiconductor chips 220. The second one of the semiconductor chips 220 is disposed at a position slightly shifted from the first one of the semiconductor chips 220 in the X-direction. The third one of the semiconductor chips 220 contacts with the main surface 221 of the second one of the semiconductor chips 220. The third one of the semiconductor chips 220 is disposed at a position further shifted in the same direction as the second one of the semiconductor chips 220.

Note that the shift direction of the semiconductor chips 220 in the X-direction may be reversed in any of the semiconductor chips 220 toward the negative direction of Z. In the example of FIG. 1, the fourth one of the semiconductor chips 220 contacting with the main surface 221 of the third one of the semiconductor chips 220 is disposed at a position shifted in the X-direction opposite to the third one of the semiconductor chips 220.

The wire 240 is configured to include at least any of metal materials of Au, Cu, Pd, Cu, and Ag. The wire 240 is electrically connected to the semiconductor element (not illustrated) on the main surface 221 of the semiconductor chip 220. The wire 240 penetrates the molding material 250 to be described later and is formed substantially vertically from the main surface 221 of the semiconductor chip 220 toward a side opposite to the support 210, that is, toward the negative direction of Z. Since the semiconductor chips 220 are stacked while being shifted in the X-direction as described above, it is possible to prevent the wires 240 extending toward the negative direction of Z from coming into contact with each other. The wire 240 is connected to an electrode pad 241 on a surface of the molding material 250 on the printed wiring board 100 side.

With this configuration, the semiconductor element (not illustrated) of the semiconductor chip 220 and the solder ball 300*a* to be described later are electrically connected via the electrode pad 241.

Note that, when stacking the semiconductor chips 220, the pedestal 230 may be provided as illustrated in the example of FIG. 1. The pedestal 230 is a small piece of a Si substrate or the like. The pedestal 230 is disposed, for example, between a surface of the semiconductor chip 220 with the maximum shift in the X-direction on the support 210 side and the support 210. In the example of FIG. 1, the pedestal 230 is disposed between a surface of the third one of the semiconductor chips 220 on the support 210 side and the support 210. With this configuration, when stress is applied to the main surface 221 toward the positive direction of Z at the time of forming the wire 240, the semiconductor chip 220 can be supported from the surface on the support 210 side. As a result, peeling and cracking of the semiconductor chip 220 are suppressed.

The molding material 250 is, for example, a thermosetting resin or the like such as an epoxy resin or an acrylic resin. The molding material 250 seals the support 210, the stacked semiconductor chips 220, the pedestal 230, and the wire 240.

The module 200 with the above-described configuration is mounted on an upper surface of the adhesive 400*a* to be described later and mounted inward from the step 101 of the printed wiring board 100 in a state where the main surface 221 of the semiconductor chip 220 faces the printed wiring board 100 side. Such a mounting method of the module 200 is also referred to as a flip chip method.

The solder ball 300*a* is disposed between the lower surface of the module 200 and the upper surface of the printed wiring board 100. A surface of the solder ball 300*a* on the module 200 side is connected to the electrode pad 241 and is electrically connected to the wire 240. A surface of the solder ball 300*a* on the printed wiring board 100 side is electrically connected to the electrode 140 of the printed wiring board 100. With this configuration, the printed wiring board 100 and the module 200 are electrically connected via the solder balls 300*a*.

The adhesive 400*a* is called, for example, an underfill agent and is made of a liquid epoxy resin or the like. The adhesive 400*a* is provided between the printed wiring board 100 and the module 200. More specifically, in a view from the positive direction of Z, a side surface of the adhesive 400*a* and the side surface 102 of the step 101 are disposed at a position where the side surface and the side surface 102 overlap with one another.

By disposing the adhesive 400*a* between the printed wiring board 100 and the module 200, a connection part between the electrode pad 241 and the solder ball 300*a* and a connection part between the solder ball 300*a* and the electrode 140 are protected.

The sealing member 500*a* is, for example, a thermosetting resin film of an epoxy resin, an acrylic resin, or the like. The sealing member 500*a* covers the step 101, the side surface of the adhesive 400*a*, and the entire module 200. With this configuration, the step 101, the side surface of the adhesive 400*a*, and the entire module 200 are sealed while the adhesive 400*a* is prevented from being exposed on a surface of the sealing member 500*a*.

Method of Manufacturing Semiconductor Device

Next, a method of manufacturing the semiconductor device 1 according to the first embodiment will be described with reference to FIGS. 2A to 2D and FIGS. 3A and 3B.

FIGS. 2A to 2D and FIGS. 3A and 3B are XZ cross-sectional views sequentially illustrating part of a procedure of the method of manufacturing the semiconductor device according to the first embodiment.

Figure 2A:
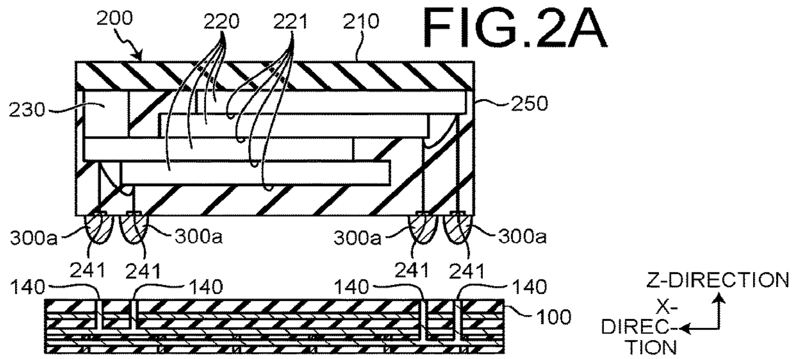
FIGS. 2A to 2D are cross-sectional views sequentially illustrating part of a procedure of a method of manufacturing the semiconductor device according to the first embodiment.

In the method of manufacturing the semiconductor device according to the first embodiment, the module 200 is formed prior to the process of FIG. 2A.

First, the semiconductor chips 220 are stacked on the support 210 while being sequentially shifted in the X-direction. At this time, for example, the pedestal 230 may be provided between the semiconductor chip 220 with the maximum shift in the X-direction and the support 210. Next, the wires 240 are formed. The wires 240 are connected to the semiconductor elements (not illustrated) disposed on the main surfaces 221 of the semiconductor chips 220. The wires 240 extend in the stacking direction of the semiconductor chips 220. Then, the support 210, the semiconductor chips 220, and the wires 240 are sealed with the molding material 250. By these processes, the module 200 is formed.

Thereafter, in order to mount the module 200 on the printed wiring board 100, the solder balls 300*a* are formed on the surface of the molding material 250 on a side opposite to the support 210. The solder balls 300*a* are formed using, for example, a thermocompression bonding technique, an ultrasonic bonding technique, or a mass reflow technique in which solder pieces arranged in an array are dissolved to form solder balls at one time.

As illustrated in FIG. 2A, the module 200 subjected to the manufacturing process described above is picked up by a picker or the like with the support 210 side facing upward.

Figure 2B:
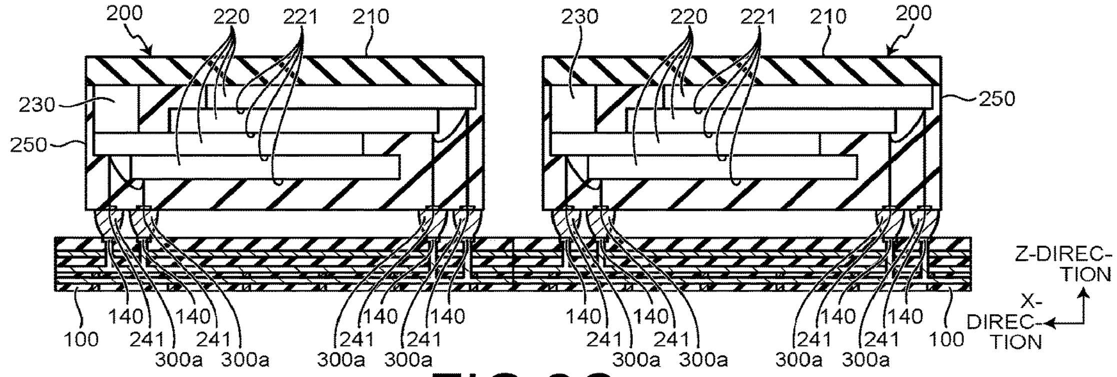

As illustrated in FIG. 2B, the module 200 is mounted on the printed wiring board 100. Specifically, the solder ball 300*a* of the module 200 is stacked on the electrode 140 of the printed wiring board 100, thereby mounting the module 200 on the printed wiring board 100. With this configuration, the conductive layer 120 of the printed wiring board 100 and the module 200 are electrically connected.

The modules 200 adjacent to each other with interposing a peripheral edge part 200*g* between them are arranged at predetermined intervals in the X-direction and a Y-direction. The Y-direction is a direction orthogonal to the X and Z-directions.

Figure 2C:
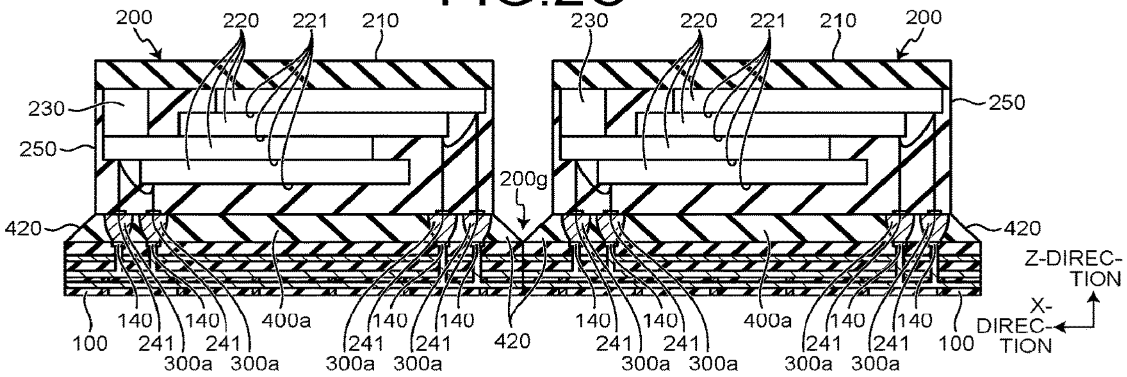

As illustrated in FIG. 2C, the adhesive 400*a* is injected between the upper surface of the printed wiring board 100 and the lower surface of the module 200. For example, in a case where the adhesive 400*a* is a thermosetting resin, the adhesive 400*a* is cured by heating in an oven or the like. In addition, for example, in a case where the adhesive 400*a* is an ultra violet (UV) curable resin, the adhesive 400*a* is cured by irradiation with UV light. With these configurations, the connection part between the electrode pad 241 and the solder ball 300*a* and the connection part between the solder ball 300*a* and the electrode 140 are protected.

In the process of curing described above, in a view from the positive direction of Z, the adhesive 400*a* in a wet condition may protrude from an end part of the module 200 on the outside of the module 200 and then spread toward the peripheral edge part 200*g*. In this case, a fillet 420 may be formed on the peripheral edge part 200*g* due to the adhesive 400*a* being cured.

Figure 2D:
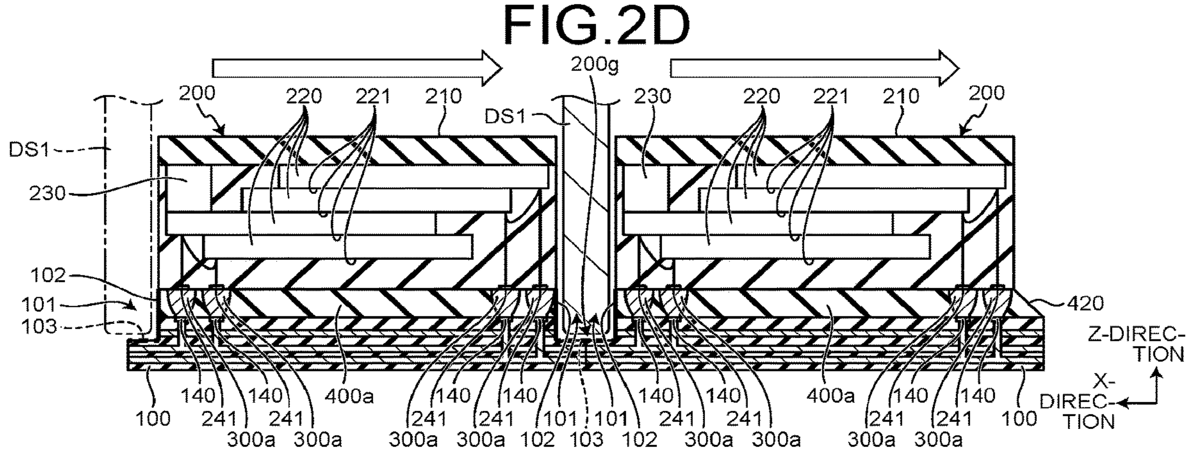

As illustrated in FIG. 2D, a dicing saw DS1 is pressed against the fillet 420 from the positive direction side of Z, and the fillet 420 is cut down in a thickness direction, that is, in the negative direction of Z. At this time, part of the printed wiring board 100 located at a position overlapping with the fillet 420 is also preferably cut down to a predetermined depth. As a result of the cutting process, the fillet 420 is removed, and the step 101 having the side surface 102 and the bottom surface 103 is formed on the surface of the printed wiring board 100. At this time, a cut surface of the adhesive 400*a*, which is exposed by removing the fillet 420, and the side surface 102 of the step 101 are formed so as to overlap with one another in a view from the positive direction of Z. In addition, by performing the process of FIG. 2D on both the peripheral edge part 200*g* extending in the X-direction and the peripheral edge part 200*g* extending in the Y-direction, the step 101 extends in the X-direction and the Y-direction of the printed wiring board 100.

When cutting the fillet 420 and the printed wiring board 100, it is preferable to use the dicing saw DS1 whose width is substantially the same as an interval L between the modules 200 adjacent to each other, or wider than the interval L. With this configuration, the fillet 420 can be removed at one time. Note that, in a case where the dicing saw DS1 whose width is larger than the interval L is used, a side surface of the module 200 is also removed at the time of cutting the fillet 420.

In addition, conditions of cutting by the dicing saw DS1 may be adjusted so as to increase the surface roughness of a cut surface of the printed wiring board 100, that is, the bottom surface 103 of the step 101. With this configuration, fine irregularities are formed on the surface of the bottom surface 103. Therefore, when the sealing member 500*a* is formed, adhesion between the bottom surface 103 and the sealing member 500*a* is enhanced by a so-called anchor effect.

Note that the forming of the step 101 and the cutting of the fillet 420 and the side surface of the module 200 may be performed by, for example, laser processing, wire processing, or the like, instead of processing by the dicing saw DS1.

Figure 3A:
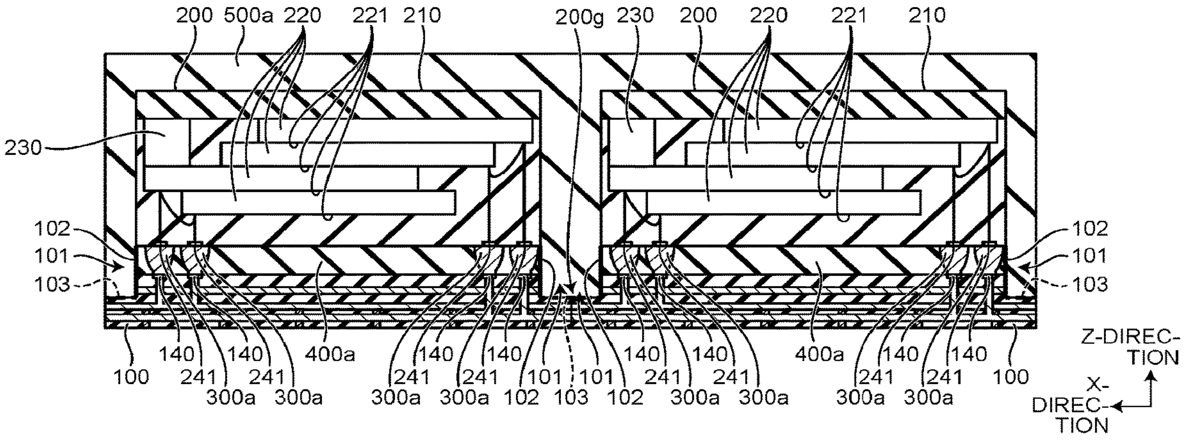
FIGS. 3A and 3B are cross-sectional views sequentially illustrating part of the procedure of the method of manufacturing the semiconductor device according to the first embodiment.

As illustrated in FIG. 3A, the sealing member 500*a*, which is a resin film, is formed to cover the entire surface of the printed wiring board 100 including the plurality of modules 200. That is, the sealing member 500*a* is formed over the modules 200 including their respective peripheral edge parts 200*g* so as to cover the whole of the modules 200 and the peripheral edge parts 200*g*. With this configuration, the side surface of the module 200, the side surface of the adhesive 400*a* appearing by removing the fillet 420, and the step 101 are covered with the sealing member 500*a*.

Figure 3B:
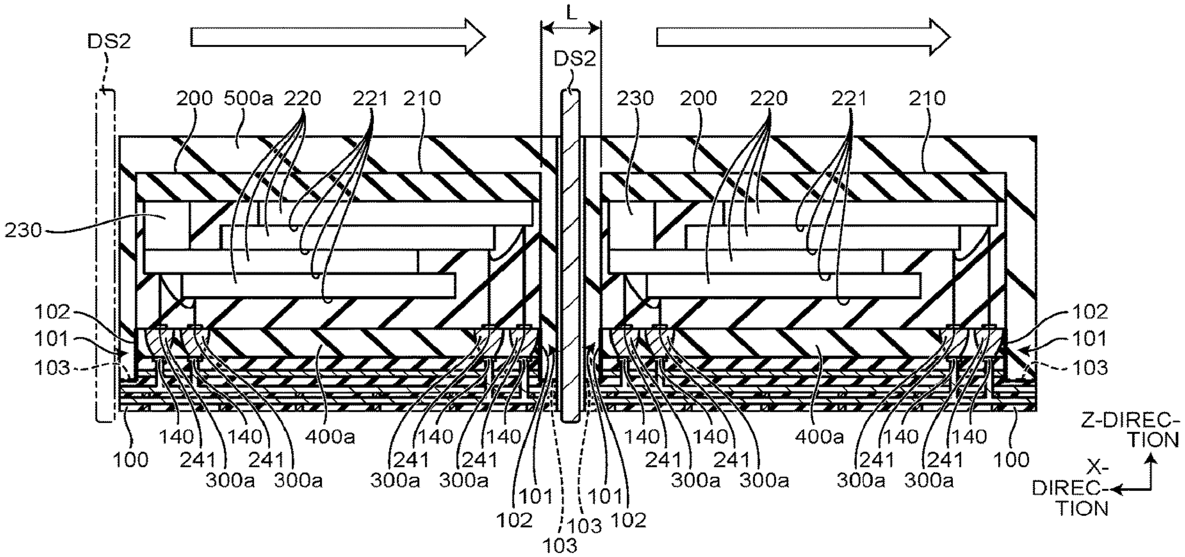

As illustrated in FIG. 3B, a dicing saw DS2 is pressed on the side of the peripheral edge part 200*g*, which is outer than the step 101 from the positive direction side of Z, to cut the printed wiring board 100 in the Z-direction. With this configuration, the modules 200 are diced.

Note that, when dicing the modules 200, the dicing saw DS2 whose width is narrower than the interval L between the modules 200 adjacent to each other is used. With this configuration, the modules 200 can be diced in a state where the sealing member 500*a* is left on the side surface of the module 200.

In the manner described above, the semiconductor device 1 according to the first embodiment is manufactured.

Comparative Example

Figure 4A:
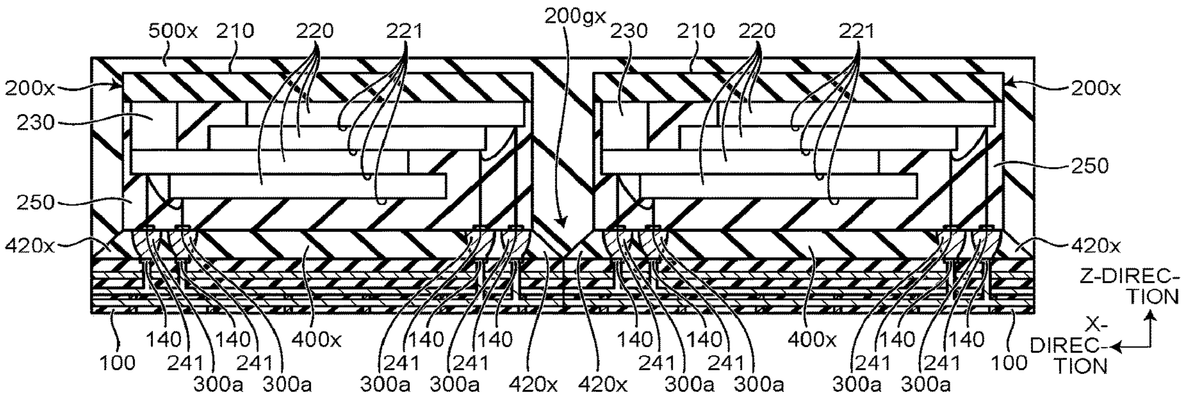
FIGS. 4A to 4C are cross-sectional views illustrating an example of a configuration of a semiconductor device according to a comparative example.
Figure 4B:
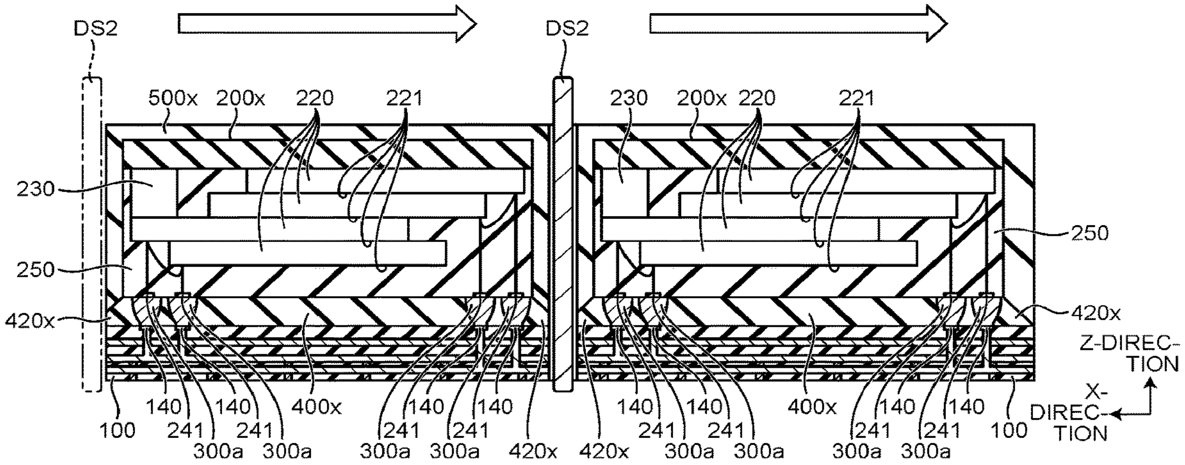

Next, a semiconductor device 1*x* according to a comparative example will be described with reference to FIGS. 4A to 4C. FIGS. 4A and 4B illustrate an example of a method of manufacturing the semiconductor device 1*x* according to the comparative example, and FIG. 4C is a diagram illustrating a configuration example of the semiconductor device 1*x* according to the comparative example.

As illustrated in FIG. 4A, in a manufacturing process of the semiconductor device 1*x* according to the comparative example, an adhesive 400*x* and a sealing member 500*x* are formed after modules 200*x* are mounted. In a view from the positive direction of Z, a fillet 420*x* is formed over a peripheral edge part 200*gx* on the outside of the module 200*x*. The fillet 420*x* is part of the adhesive 400*x* that protrudes from an end part of the module 200*x* and is cured after spreading in a wet condition.

As illustrated in FIG. 4B, the dicing saw DS2 is pressed against the peripheral edge part 200*gx* from the positive direction side of Z. The printed wiring board 100 is cut in the Z-direction to dice the modules 200*x*.

Figure 4C:
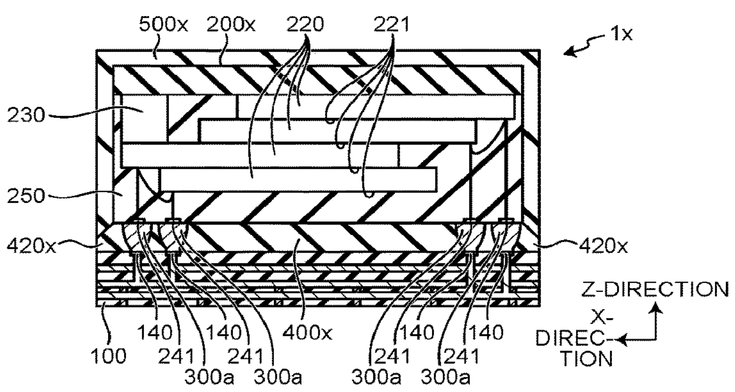

As illustrated in FIG. 4C, in the semiconductor device 1*x* subjected to the above-described manufacturing process, part of the adhesive 400*x* may be exposed on a surface of the sealing member 500*x*. This is because, when dicing the modules 200*x*, part of the fillet 420*x* formed on the peripheral edge part 200*gx* is cut by the dicing saw DS2. As a result, a cut surface of the fillet 420*x* is exposed.

In such a case, the flame retardancy of the semiconductor device 1*x* according to the comparative example may be deteriorated. This is because the adhesive 400*x* with poor flame retardancy is exposed on the surface of the semiconductor device 1*x*. In addition, the moisture absorption reflowability of the semiconductor device 1*x* according to the comparative example may be deteriorated. This is because the adhesive 400*x* exposed on the surface of the semiconductor device 1*x* absorbs moisture in the air, the absorbed moisture expands when the temperature of the semiconductor device 1*x* is raised, and peeling or rupture may occur in the semiconductor device 1*x*.

In order to avoid the exposure of the fillet 420*x*, it is necessary to cut a further outer region of the fillet 420*x* and widen a mounting region of the module 200*x* as a whole. In a case where the substantial mounting area of the module 200*x* is secured to be wider, downsizing of the semiconductor device 1 may be hindered.

In contrast, according to the method of manufacturing the semiconductor device 1 of the first embodiment, the fillet 420 of the adhesive 400*a* protruding from the lower surface of the module 200 is removed by cutting down in the thickness direction in a view from the positive direction of Z. Then, the sealing member 500*a* is formed so as to cover the adhesive 400*a* and the module 200, and the sealing member 500*a* and the printed wiring board 100 are cut at the position of the peripheral edge part 200*g* to dice the module 200.

With the configuration above, the exposure of the adhesive 400*a* to the surface of the sealing member 500*a* can be suppressed. Therefore, the flame retardancy and the moisture absorption reflowability can be enhanced.

According to the method of manufacturing the semiconductor device 1 according to the first embodiment, when removing the fillet 420, the printed wiring board 100 is cut down to a predetermined depth in the negative direction of Z along the cut surface of the adhesive 400*a*, thereby forming the step 101 on the surface of the printed wiring board 100.

With the configuration above, the fillet 420 formed on the upper surface of the printed wiring board 100 can be more reliably removed. Therefore, the exposure of the adhesive 400*a* to the surface of the sealing member 500*a* can be more effectively suppressed. Moreover, it is possible to further enhance the flame retardancy and the moisture absorption reflowability.

There are other effects obtained by the step 101 on the surface of the printed wiring board 100. When heat treatment is performed at the time of curing the adhesive 400*a* and the sealing member 500*a* to be described later, the printed wiring board 100, the module 200, the sealing member 500*a*, and so forth are each shrunk by heat, and stress may be generated in each part. Such stress may cause warpage and undulation in the entire printed wiring board 100.

Even in such a case above, by forming the step 101 on the surface of the printed wiring board 100, the stress applied to each part of the printed wiring board 100 is alleviated, and warpage and undulation of the entire printed wiring board 100 are reduced. Therefore, peeling at the printed wiring board 100, the module 200, the sealing member 500*a*, and so forth are each suppressed. In addition, cut accuracy when dicing the modules 200 is enhanced.

In addition, according to the method of manufacturing the semiconductor device 1 according to the first embodiment, the sealing member 500*a* is formed over the entire module 200 from the step 101 with a predetermined depth in the negative direction of Z.

A leg part of the sealing member 500*a* is formed so as to fall into the bottom surface 103 of the step 101. Therefore, adhesion between the printed wiring board 100 and the module 200, and the sealing member 500*a* is further enhanced. With this configuration, even when warpage and undulation occur in the printed wiring board 100, peeling at each part of the printed wiring board 100, the module 200, and the sealing member 500*a* is more effectively suppressed. As a result, reflow resistance and temperature cycling test (TCT) performance of the semiconductor device 1 are enhanced.

In addition, according to the method of manufacturing the semiconductor device 1 according to the first embodiment, the surface of the bottom surface 103 may be roughened by the dicing saw DS1.

With the configuration above, the sealing member 500*a* is formed so as to enter the irregularities of the surface of the bottom surface 103. Therefore, the adhesion between the bottom surface 103 and the sealing member 500*a* is further enhanced. Peeling of each part in the printed wiring board 100, the module 200, and the sealing member 500*a* is more effectively suppressed. As a result, reflow resistance and TCT performance of the semiconductor device 1 are further enhanced.

First Modification

A method of manufacturing the semiconductor device according to a first modification of the first embodiment will be described with reference to FIGS. 5A and 5B. The method of manufacturing the semiconductor device according to the first modification is different from the first embodiment described above in that, solder balls 300*b* are provided in advance on the printed wiring board 100 side.

Figure 5A:
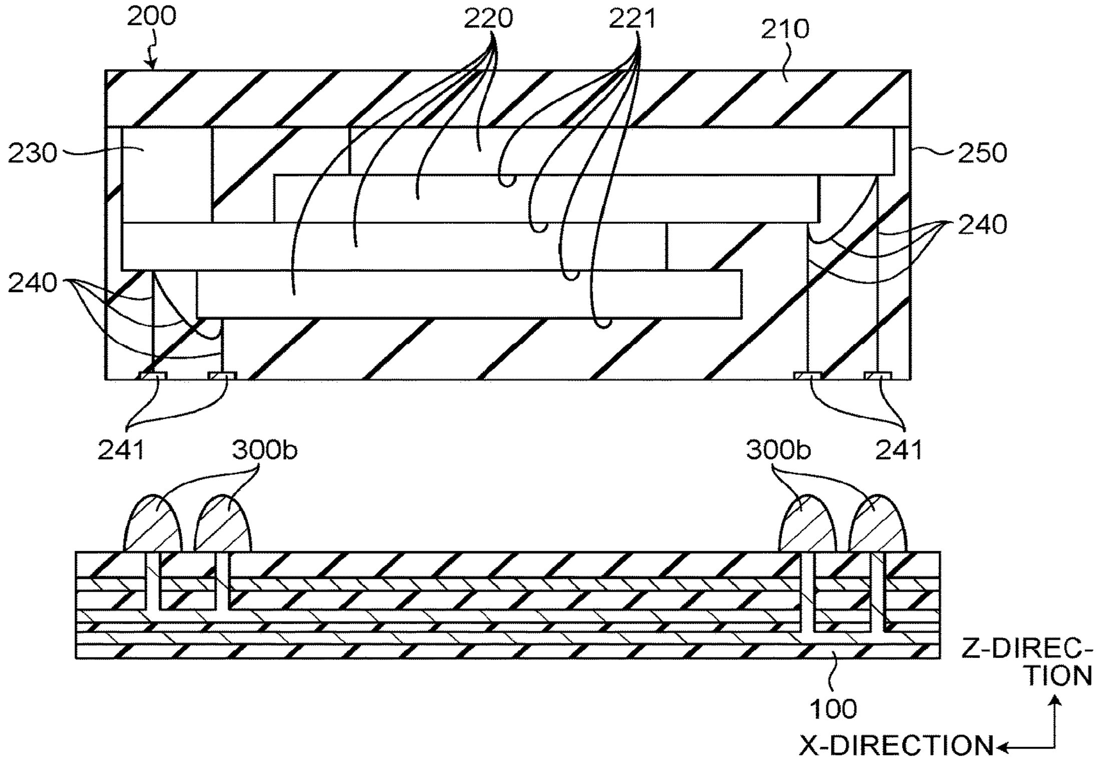
FIGS. 5A and 5B are cross-sectional views illustrating part of a procedure of a method of manufacturing the semiconductor device according to a first modification of the first embodiment.
Figure 5B:
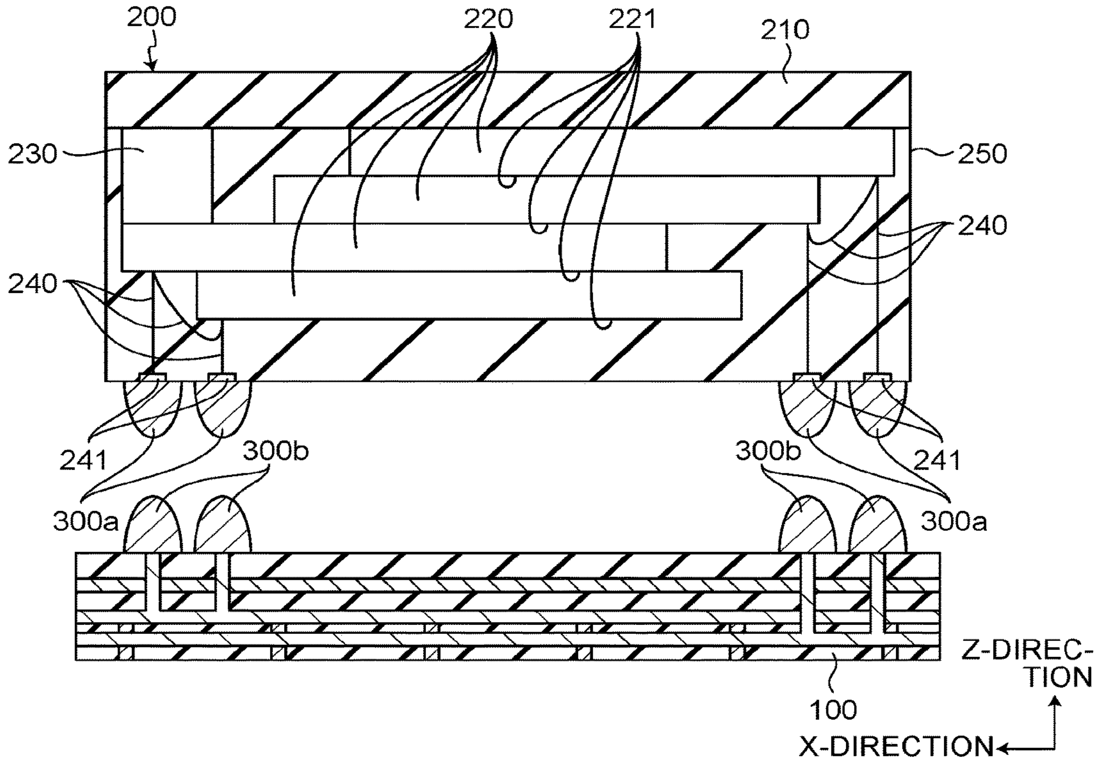

FIGS. 5A and 5B are cross-sectional views illustrating part of a procedure of the method of manufacturing the semiconductor device according to the first modification of the first embodiment. Note that each of FIGS. 5A and 5B is a diagram illustrating a manufacturing process corresponding to FIG. 2A described above.

FIG. 5A illustrates an example in which the module 200 is mounted using the solder balls 300*b*. That is, as illustrated in FIG. 5A, the solder balls 300*b* are formed in advance on the printed wiring board 100 side. The electrode pads 241 of the module 200 are stacked on the solder balls 300*b* to mount the module 200 on the printed wiring board 100. With this configuration, the printed wiring board 100 and the module 200 are electrically connected.

In addition, FIG. 5B illustrates an example in which the module 200 is mounted using the solder balls 300*a* and the solder balls 300*b*. That is, as illustrated in FIG. 5B, the solder balls 300*a* are formed in advance on the module 200 side, and the solder balls 300*b* are formed in advance on the printed wiring board 100 side. The solder balls 300*a* are stacked on the solder balls 300*b* to mount the module 200 on the printed wiring board 100. With this configuration, the printed wiring board 100 and the module 200 are electrically connected.

For processing after each of FIGS. 5A and 5B, the processing of FIGS. 2A to 2D and FIGS. 3A and 3B of the first embodiment is performed.

Second Modification

A method of manufacturing the semiconductor device according to a second modification of the first embodiment will be described with reference to FIGS. 6A and 6B.

Figure 6A:
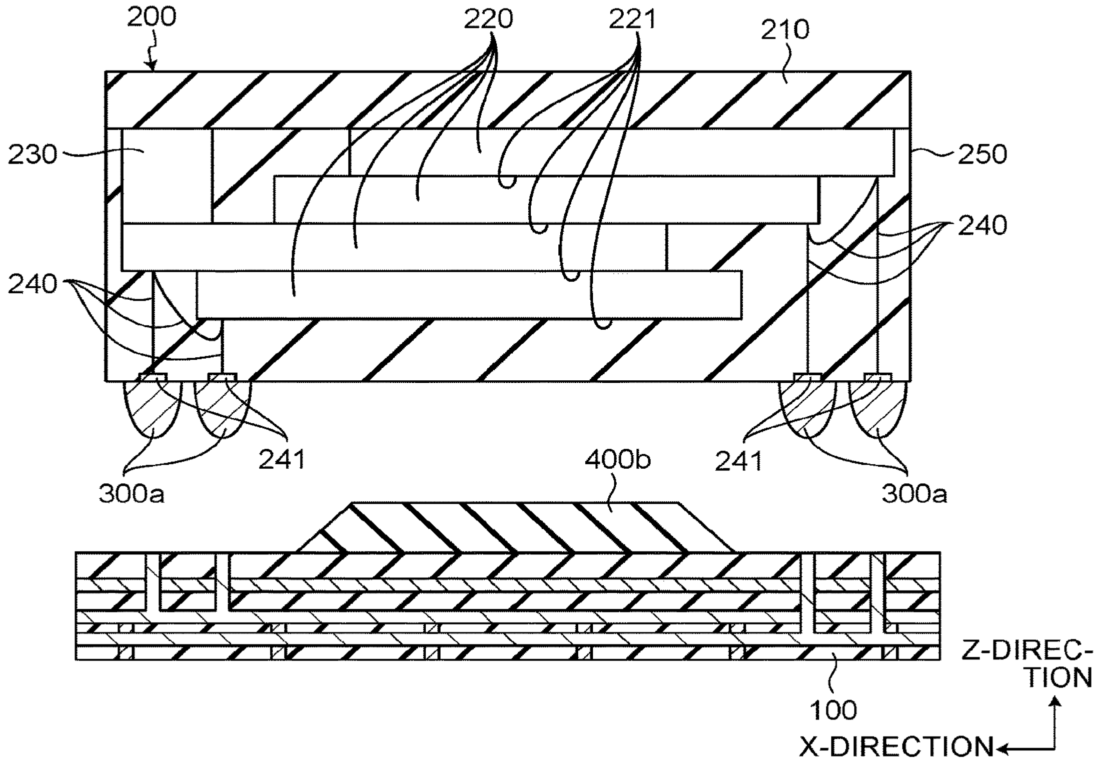
FIGS. 6A and 6B are cross-sectional views illustrating part of a procedure of a method of manufacturing the semiconductor device according to a second modification of the first embodiment.
Figure 6B:
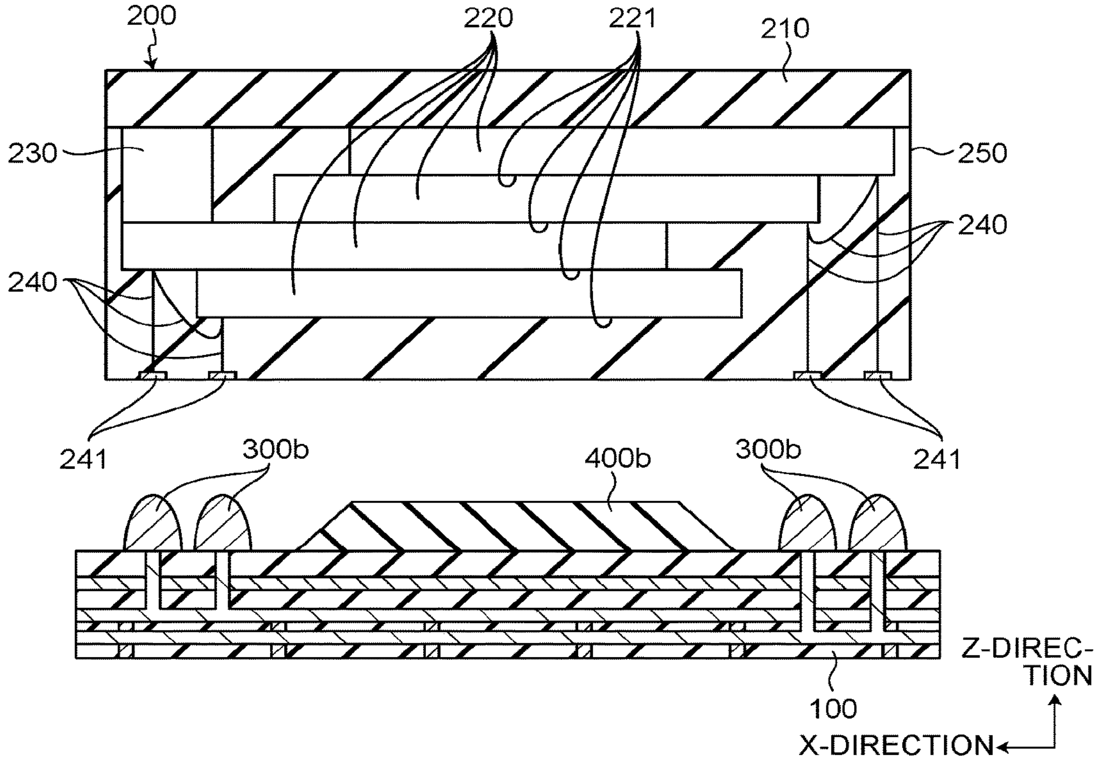

FIGS. 6A and 6B are cross-sectional views illustrating part of a procedure of the method of manufacturing the semiconductor device according to the second modification of the first embodiment. Note that each of FIGS. 6A and 6B is a diagram illustrating manufacturing processes corresponding to FIGS. 2A and 2C described above.

FIG. 6A is a modification corresponding to the first embodiment. The modification illustrated in FIG. 6A is different from the first embodiment in that, a bonding part between the module 200 and the printed wiring board 100 is protected with an adhesive 400*b*.

The adhesive 400*b* is called, for example, a non-conductive paste (NCP), and is made of a paste-like epoxy resin or the like. Unlike the adhesive 400*a* injected between the module 200 and the printed wiring board 100 after the module 200 is mounted, the adhesive 400*b* is applied to the upper surface of the printed wiring board 100 before the module 200 is mounted. The adhesive 400*b* is cured after the module 200 is mounted on an upper surface of the adhesive 400*b*.

In addition, FIG. 6B is a modification corresponding to the first modification of FIG. 5A. The modification illustrated in FIG. 6B is different from the first modification in that, the bonding part between the module 200 and the printed wiring board 100 is protected with the adhesive 400*b*. That is, as illustrated in FIG. 6B, the module 200 is mounted on the printed wiring board 100 on which the solder balls 300*a* and the adhesive 400*b* formed in advance are provided, and then the adhesive 400*b* is cured.

Note that, similarly to FIG. 5B, the adhesive 400*b* may be applied to a configuration that the solder balls 300*a* and 300*b* are formed in advance respectively on the module 200 and the printed wiring board 100.

For processing after each of FIGS. 6A and 6B, the processing of FIGS. 2A, 2B, and 2D and FIGS. 3A and 3B is performed with the exception of the processing of FIG. 2C of the first embodiment.

Third Modification

A method of manufacturing the semiconductor device according to a third modification of the first embodiment will be described with reference to FIGS. 7A and 7B.

Figure 7A:
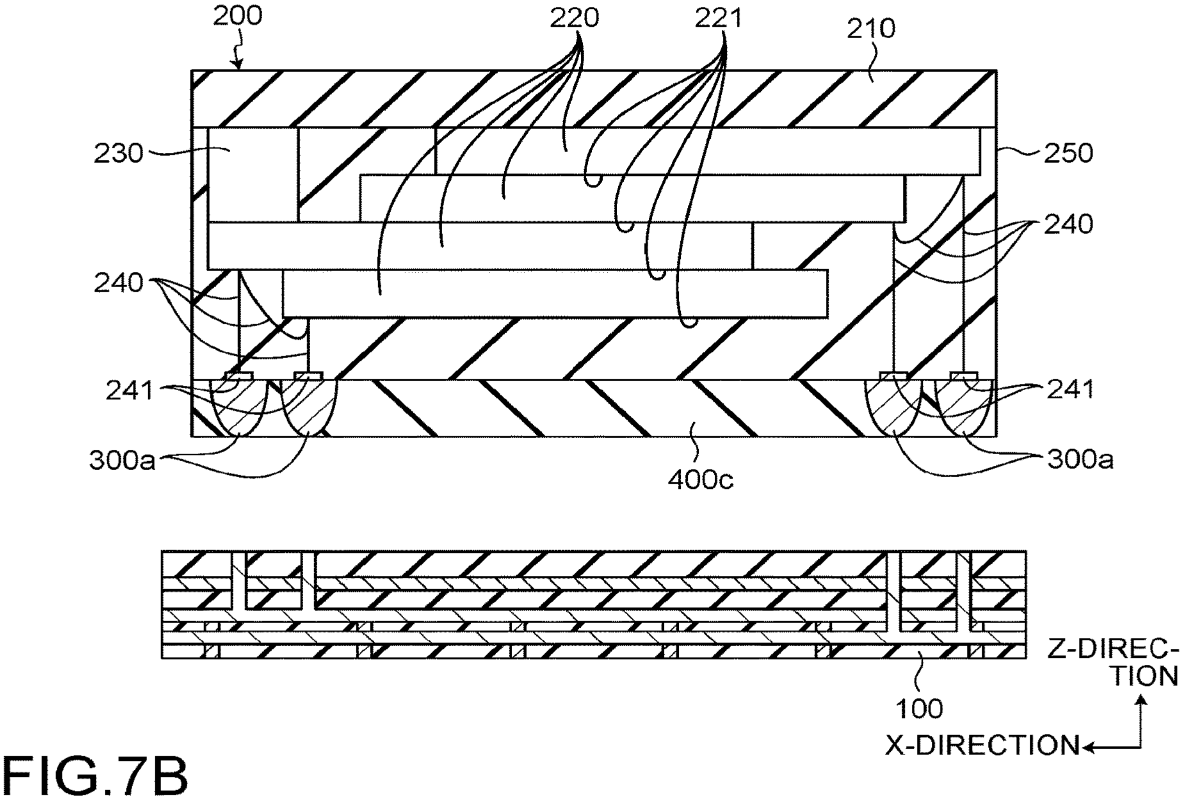
FIGS. 7A and 7B are cross-sectional views illustrating part of a procedure of a method of manufacturing the semiconductor device according to a third modification of the first embodiment.
Figure 7B:
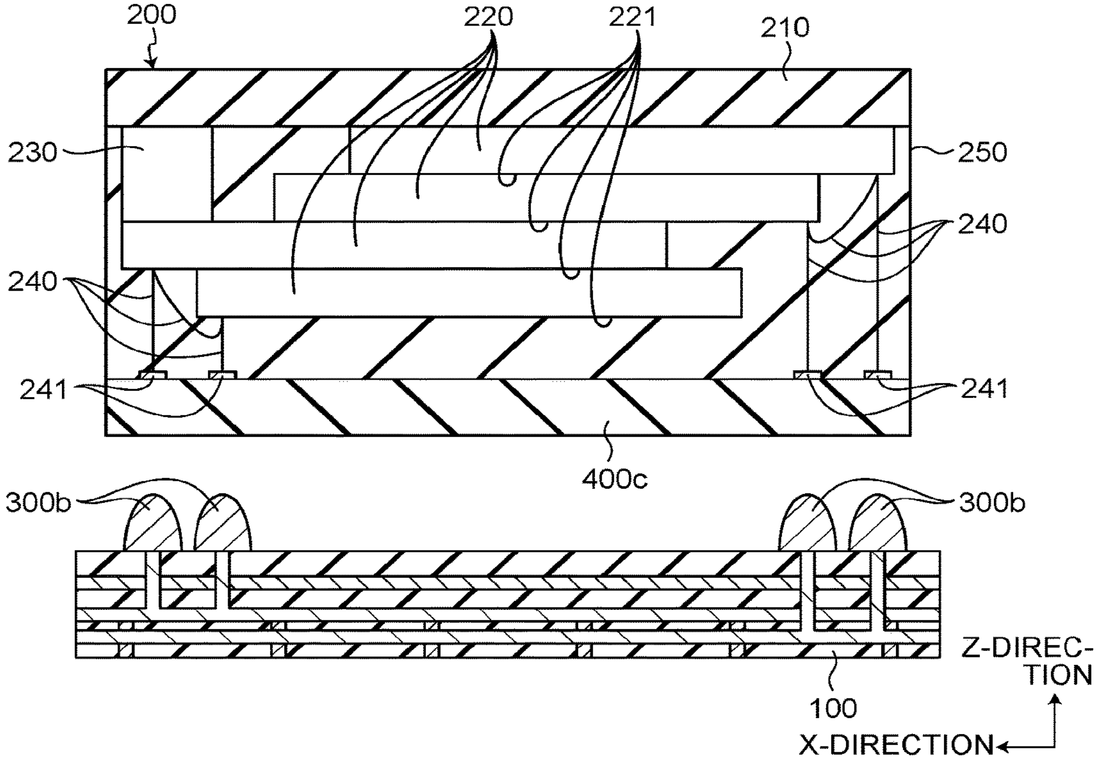

FIGS. 7A and 7B are cross-sectional views illustrating part of a procedure of the method of manufacturing the semiconductor device according to the third modification of the first embodiment. Note that each of FIGS. 7A and 7B is a diagram illustrating manufacturing processes corresponding to FIGS. 2A and 2C described above.

FIG. 7A is a modification corresponding to the first embodiment and the first modification of FIG. 6A. The modification illustrated in FIG. 7A is different from the first embodiment and the first modification in that, the bonding part between the module 200 and the printed wiring board 100 is protected with an adhesive 400*c*.

The adhesive 400*c* is called, for example, a non-conductive film (NCF), and is made of a sheet-like epoxy resin or the like. Unlike the adhesive 400*a* injected between the module 200 and the printed wiring board 100 after the module 200 is mounted and the adhesive 400*b* applied to the upper surface of the printed wiring board 100 before the module 200 is mounted, the adhesive 400*c* is previously attached to a bottom surface of the module 200 before the module 200 is mounted. The adhesive 400*c* is cured after the module 200 is mounted on the printed wiring board 100.

In addition, FIG. 7B is a modification corresponding to the first modification of FIG. 5A and the second modification of FIG. 6B, and is different from the first modification and the second modification described above in that the bonding part between the module 200 and the printed wiring board 100 is protected with the adhesive 400*c*. That is, as illustrated in FIG. 7B, the module 200 on which the adhesive 400*c* is formed in advance is mounted on the printed wiring board 100 including the solder balls 300*b*, and then the adhesive 400*c* is cured.

Note that, similarly to FIG. 5B, the adhesive 400*c* may be applied to a configuration that the solder balls 300*a* and 300*b* are formed in advance respectively on the module 200 and the printed wiring board 100.

For processing after each of FIGS. 7A and 7B, the processing of FIGS. 2B and 2D and FIGS. 3A and 3B is performed with the exception of the processing of FIG. 2C of the first embodiment.

Fourth Modification

A semiconductor device according to a fourth modification of the first embodiment will be described with reference to FIG. 8A. The semiconductor device according to the fourth modification is different from that of the first embodiment described above in that, the semiconductor chip 220 as a semiconductor module is mounted on the printed wiring board 100 in a form that the semiconductor chip 220 is not sealed with the molding material 250.

Figure 8A:
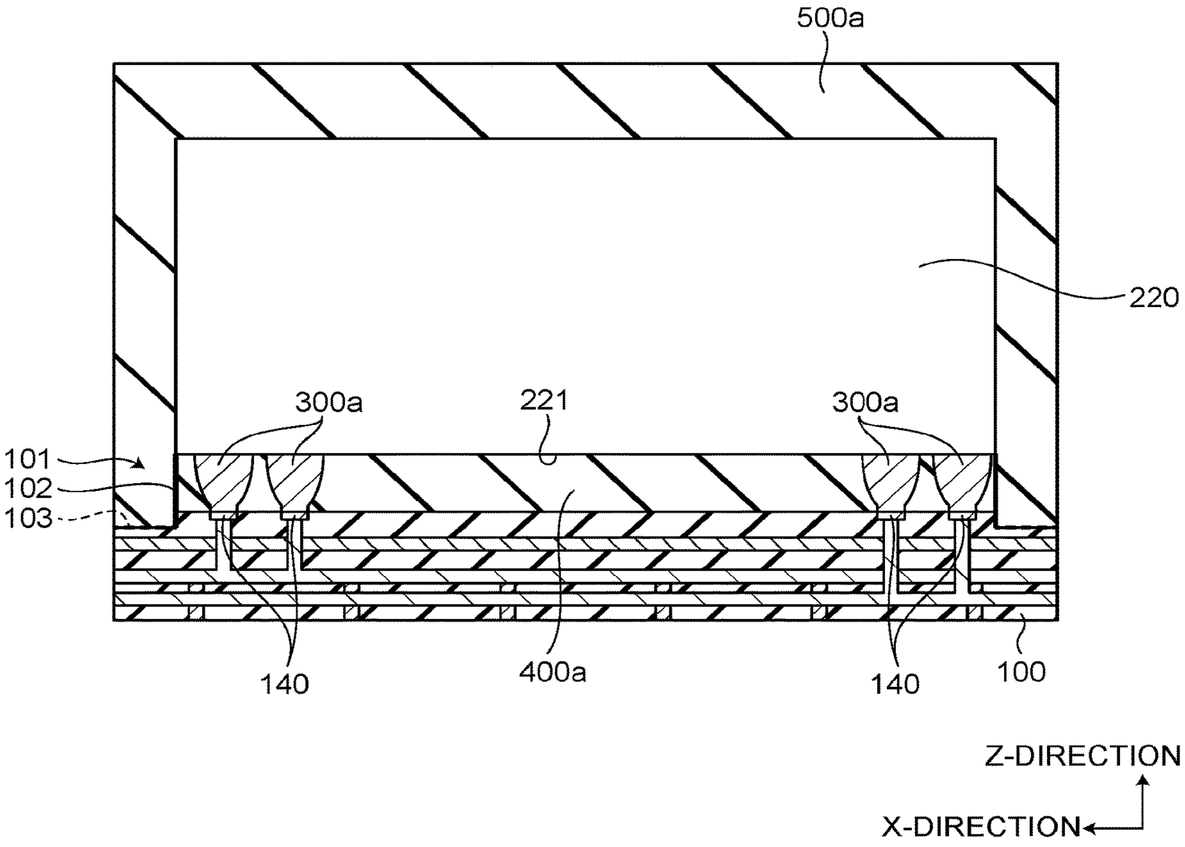
FIG. 8A is a cross-sectional view illustrating an example of a configuration of a semiconductor device according to a fourth modification of the first embodiment.

As illustrated in FIG. 8A, in the semiconductor device according to the fourth modification, the semiconductor chip 220 is directly mounted on the printed wiring board 100 with the main surface 221 facing the printed wiring board 100 side in a form that the semiconductor chip 220 is not sealed with the molding material 250. The semiconductor element (not illustrated) disposed on the main surface 221 and the electrode 140 are electrically connected via the solder ball 300*a*.

Fifth Modification

A semiconductor device according to a fifth modification of the first embodiment will be described with reference to FIG. 8B. The semiconductor device according to the fifth modification is different from that of the first embodiment described above in that, a stacked body 201 in which multiple semiconductor chips 222, in place of the semiconductor chip 220, are stacked is mounted on the printed wiring board 100.

Figure 8B:
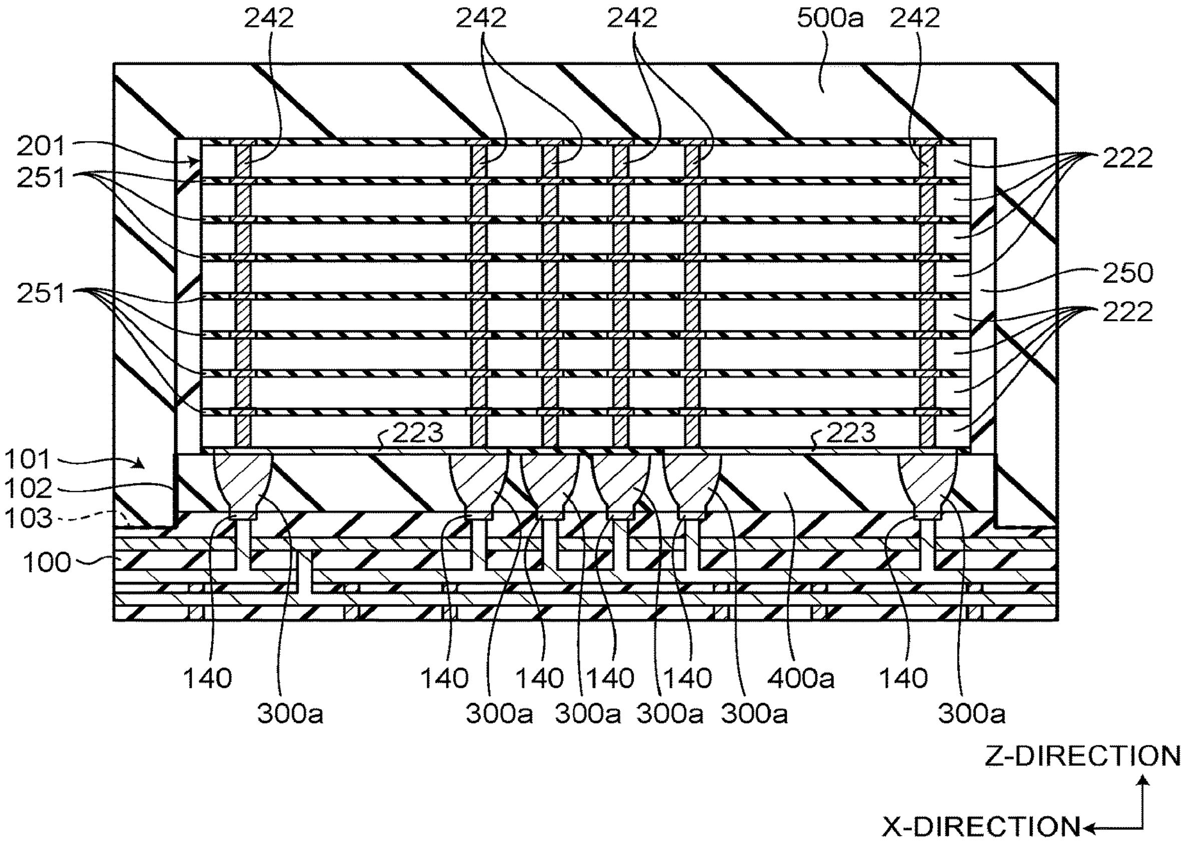
FIG. 8B is a cross-sectional view illustrating an example of a configuration of a semiconductor device according to a fifth modification of the first embodiment.

As illustrated in FIG. 8B, the semiconductor chips 222 are electrically connected by through-silicon vias (TSVs) 242. A redistribution layer (RDL) 223 may be formed on a surface of the semiconductor chip 222 disposed at a position closest to the printed wiring board 100 out of the semiconductor chips 222, the surface being on the negative direction side of Z.

In addition, a resin 251 may be formed between the semiconductor chips 222 adjacent to each other. In addition, a side surface of the stacked body 201 may be sealed with the molding material 250. The resin 251 and the molding material 250 may be the same material. The resin 251 is not necessarily formed. In place of the resin 251, the sealing member 500*a* may be formed between the semiconductor chips 222 adjacent to each other. In addition, the molding material 250 is not necessarily formed, and the stacked body 201 may be directly sealed with the sealing member 500*a*. The resin 251 may not be provided, and the semiconductor chips 222 may be formed by directly bonding to each other. In this case, for example, a Cu electrode is formed on surfaces of two semiconductor chips 222 facing each other, and an insulating film is formed so as to be substantially flush with the Cu electrode. The insulating films of the two semiconductor chips 222 are directly bonded to each other, and the Cu electrodes thereof are directly bonded to each other.

As described in the fourth modification and the fifth modification above, the form of the semiconductor chip 220 mounted on the printed wiring board 100 and the form of the stacked body 201 of the semiconductor chips 222 being stacked are not limited. In addition, also in the fourth modification and the fifth modification described above, the semiconductor chip 220 and the stacked body 201 are mounted on the printed wiring board 100 by a flip chip method.

Second Embodiment

Hereinafter, a second embodiment will be described in detail with reference to FIG. 9 and FIGS. 10A to 10C. A method of manufacturing a semiconductor device 2 according to the second embodiment is different from the first embodiment described above in that, a metal-containing film is used as a sealing member 500*b*.

Note that, in the following, similar reference numerals are given to similar configurations to those of the first embodiment described above, and the description thereof may be omitted.

Configuration Example of Semiconductor Device

Figure 9:
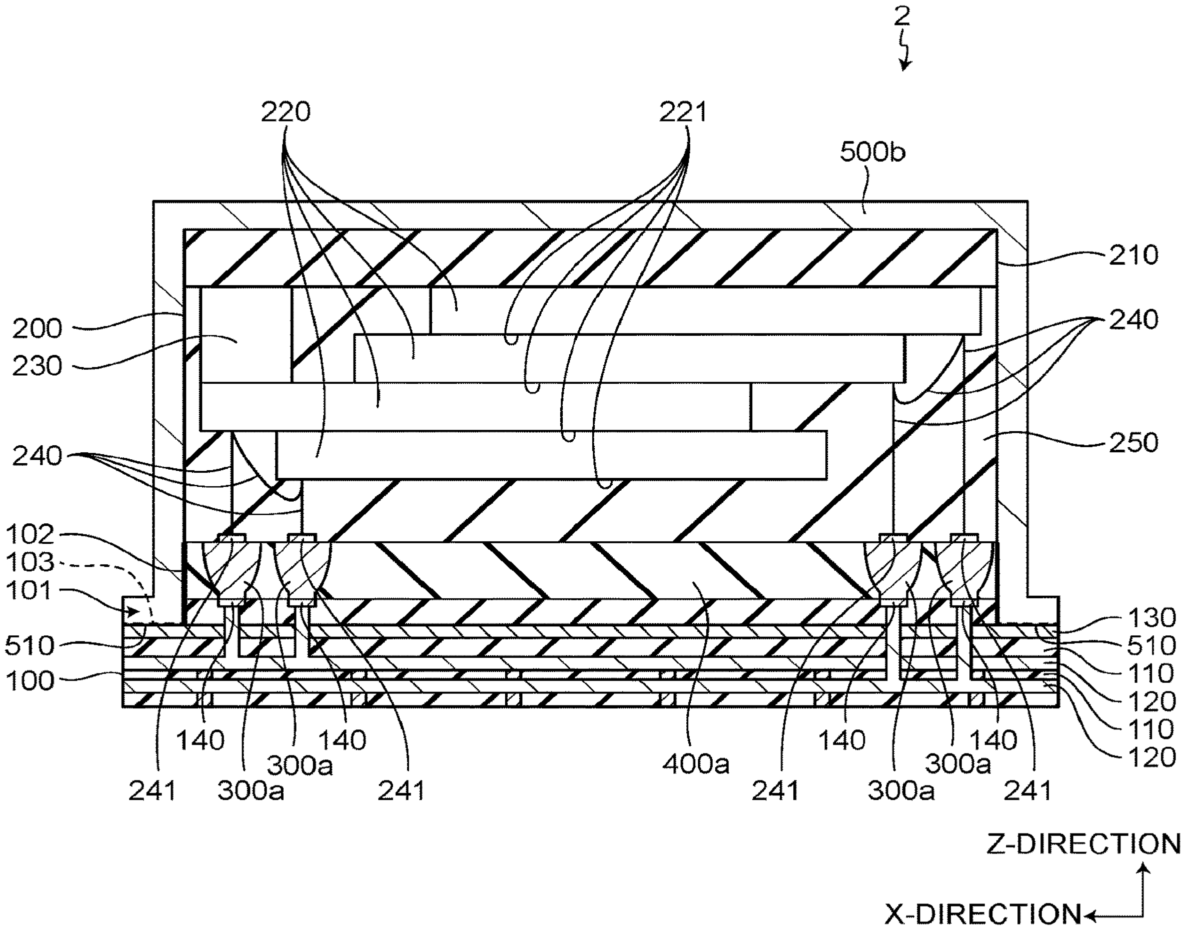
FIG. 9 is a cross-sectional view illustrating an example of a configuration of a semiconductor device according to a second embodiment.

FIG. 9 is a diagram illustrating an example of a configuration of the semiconductor device 2 according to the second embodiment. FIG. 9 is an XZ cross-sectional view of the semiconductor device 2.

As illustrated in FIG. 9, the semiconductor device 2 is configured as, for example, a package in which one or more semiconductor chips 220 are sealed. The semiconductor device 2 includes a printed wiring board 100, a module 200, solder balls 300*a*, an adhesive 400*a*, and a sealing member 500*b*.

An outer peripheral part of the printed wiring board 100 is dug down to a predetermined position toward the negative direction of Z. With this configuration, a step 101 with a side surface 102 and a bottom surface 103 is provided on a surface of the printed wiring board 100. A ground wire 130 is exposed from the bottom surface 103.

The sealing member 500*b* is made of, for example, a conductive metal or the like. The sealing member 500*b* covers the side surface 102, the bottom surface 103, a side surface of the adhesive 400*b*, and the modules 200. In addition, the sealing member 500*b* includes a drawn part 510 that extends from a side surface of the sealing member 500*b* along the bottom surface 103 of the step 101 to the outside of the side surface of the sealing member 500*b* in a view from the positive direction of Z. The sealing member 500*b* is electrically connected at the bottom surface 103 to the ground wire 130 exposed on the bottom surface 103.

Method of Manufacturing Semiconductor Device

The method of manufacturing the semiconductor device 2 according to the second embodiment will be described with reference to FIGS. 10A to 10C.

Figure 10A:
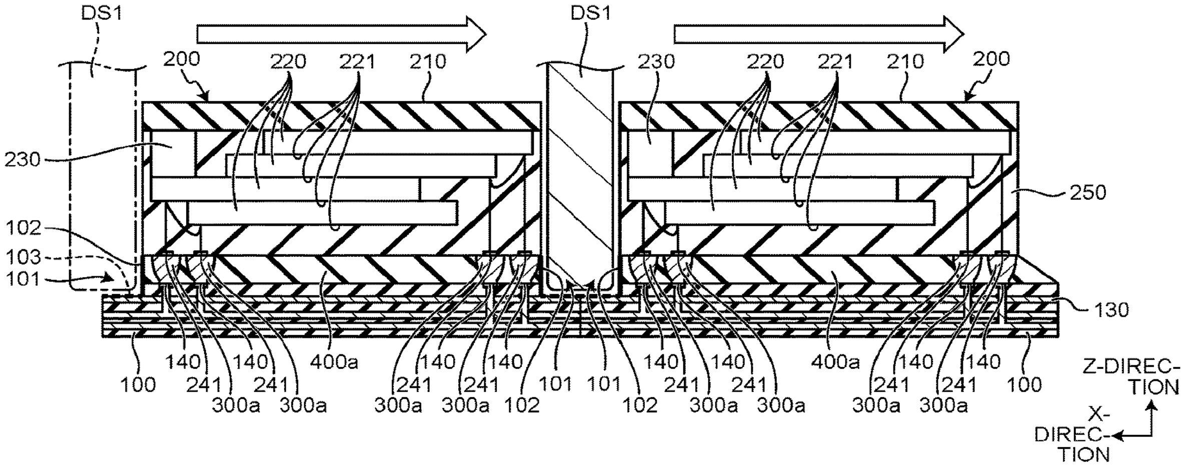
FIGS. 10A to 10C are cross-sectional views illustrating part of a procedure of a method of manufacturing the semiconductor device according to the second embodiment.
Figure 10B:
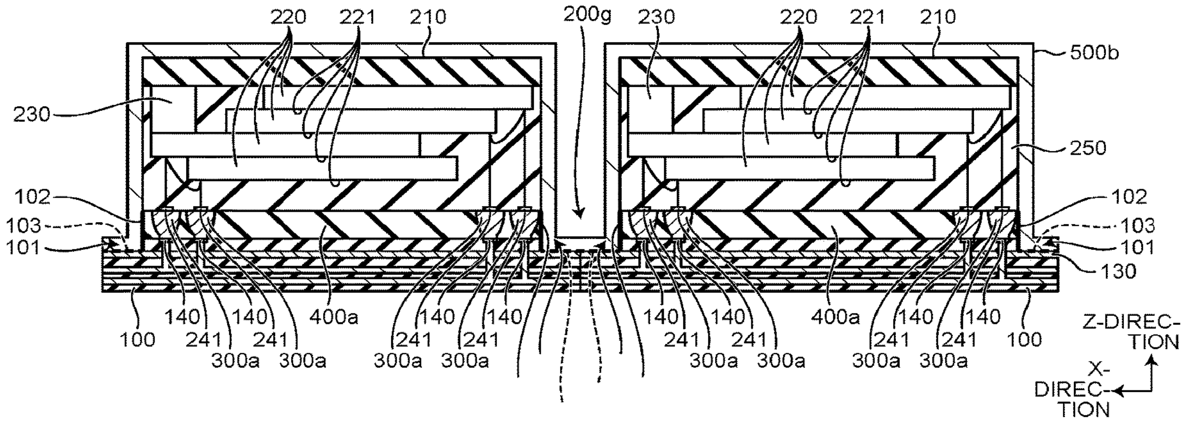
Figure 10C:
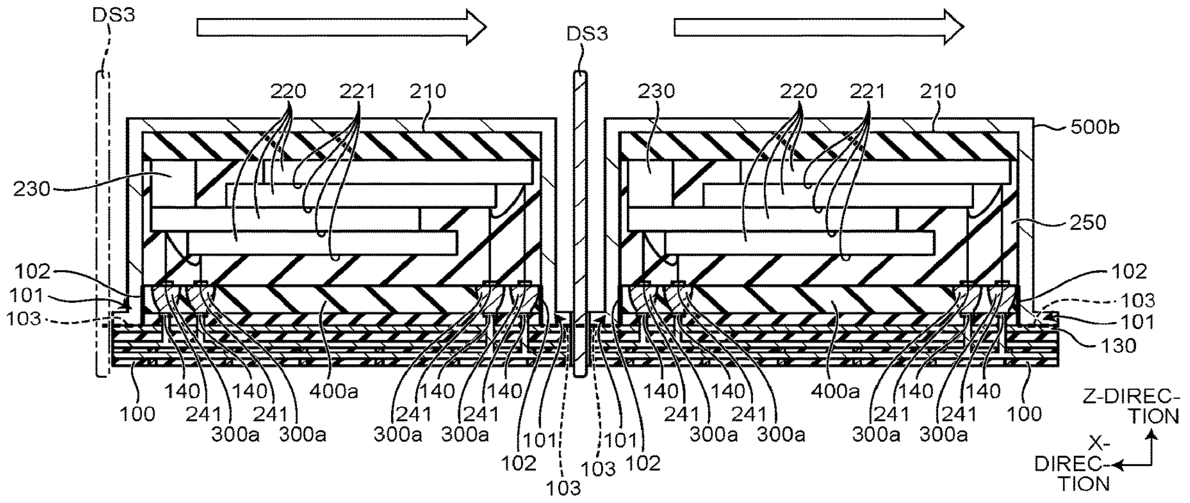

FIGS. 10A to 10C are cross-sectional views illustrating part of a procedure of the method of manufacturing the semiconductor device according to the second embodiment. Prior to the processing of FIG. 10A, the processing of FIGS. 2A to 2C of the first embodiment described above is also performed in the method of manufacturing the semiconductor device 2 according to the second embodiment.

As illustrated in FIG. 10A, a dicing saw DS1 is pressed against a fillet 420 from the positive direction side of Z, and the fillet 420 and the printed wiring board 100 at a position overlapping with the fillet 420 are cut down to a predetermined depth. With this configuration, the fillet 420 is cut in the negative direction of Z, and the step 101 having the side surface 102 and the bottom surface 103 is formed on the surface of the printed wiring board 100. At this time, the ground wire 130 is exposed on the bottom surface 103.

As illustrated in FIG. 10B, the sealing member 500*b*, which is a metal-containing film, is formed so as to cover the side surface of the adhesive 400*a*, the side surface 102, and the bottom surface 103 by a sputtering method, for example. With this configuration, the sealing member 500*b* and the ground wire 130 are electrically connected at the bottom surface 103.

As illustrated in FIG. 10C, a dicing saw DS3 is pressed against the side of a peripheral edge part 200*g* which is outer than the step 101 from the positive direction side of Z to cut the printed wiring board 100 in the Z-direction. With this configuration, the modules 200 are diced.

When dicing the modules 200, it is preferable to use the dicing saw DS3 whose width is narrower than that of the dicing saw DS1. With this configuration, it is possible to ensure a wide region of the bottom surface 103, and thereby a contact area between the drawn part 510 and the ground wire 130 can be increased.

In the manner described above, the semiconductor device 2 according to the second embodiment is manufactured.

Overview

According to the method of manufacturing the semiconductor device 2 according to the second embodiment, the sealing member 500*b* is formed to cover the adhesive 400*a* after removing the fillet 420, and the modules 200. Then, the sealing member 500*b* and the printed wiring board 100 are cut at the position of the peripheral edge part 200*g* to dice the modules 200.

With this configuration, the modules 200, the adhesive 400*a*, and the printed wiring board 100 can be sealed with the sealing member 500*b* having conductivity. Therefore, it is possible to suppress the radiation of electromagnetic waves from the semiconductor device 2 or the intrusion of electromagnetic waves into the semiconductor device 2.

According to the method of manufacturing the semiconductor device 2 according to the second embodiment, when removing the fillet 420, the printed wiring board 100 is cut down in the negative direction of Z along the cut surface of the adhesive 400*a* until the ground wire 130 is exposed from the bottom surface 103. With this configuration, the step 101 having the side surface 102 and the bottom surface 103 is formed on the surface of the printed wiring board 100.

By forming such a sealing member 500*b* on the bottom surface 103, the ground wire 130 exposed on the bottom surface 103 and the sealing member 500*b* are electrically connected. With this configuration, electromagnetic waves generated in the module 200 are grounded via the sealing member 500*b* and the ground wire 130. Therefore, it is possible to suppress the radiation of the electromagnetic waves from the semiconductor device 2.

According to the semiconductor device 2 according to the second embodiment, the sealing member 500*b* includes the drawn part 510 extending outward from the side surface of the sealing member 500*b* in a view from the positive direction of Z.

The drawn part 510 of the sealing member 500*b* is electrically connected to the ground wire 130 at the bottom surface 103. By forming such a drawn part 510, the electromagnetic waves generated in the module 200 are effectively grounded. Therefore, it is possible to more effectively suppress the radiation of the electromagnetic waves from the semiconductor device 2.

According to the semiconductor device 2 and the method of manufacturing the same according to the second embodiment, effects similar to those of the semiconductor device 1 and the method of manufacturing the same according to the first embodiment described above are obtained.

In the first and second embodiments and the first to fourth modifications described above, the semiconductor devices 1 and 2 include the printed wiring board 100. However, the wiring board on which the semiconductor chip 220 is mounted is not limited to the printed wiring board 100. The wiring board of the semiconductor devices 1 and 2 may be, for example, a silicon substrate or a glass substrate in which wiring is formed, various substrates with a redistribution layer, or the like.

In the first and second embodiments and the first to third modifications described above, the semiconductor devices 1 and 2 include the support 210. However, the support 210 may not be necessarily provided in the semiconductor devices 1 and 2. For example, the support 210 may be removed by a predetermined method after the semiconductor chip 220 is disposed on the support 210 and the semiconductor chip 220 is connected to the printed wiring board 100 via the wire 240 and the solder ball 300*a*. Note that, in this case, the semiconductor chip 220 positioned on the most positive side in the Z-direction is directly covered with the sealing member 500*a* without interposing the support 210.

In the first and second embodiments and the first to fifth modifications described above, an example in which an underfill agent, NCP, NCF, etc. are used as the adhesives 400*a*, 400*b*, and 400*c* has been described. However, the adhesive is not limited thereto, and for example, a resin for molding or the like may be used as the adhesive.

While certain embodiments have been described, these embodiments have been presented by way of example only, and are not intended to limit the scope of the inventions. Indeed, the novel embodiments described herein may be embodied in a variety of other forms; moreover, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a wiring board including a step located at an outer peripheral part of the wiring board;

an adhesive provided on an upper surface of the wiring board;

a semiconductor module disposed on an upper surface of the adhesive, the semiconductor module being mounted inward from the step of the wiring board; and a sealing member covering the step, a side surface of the adhesive, and the semiconductor module, wherein the step includes a side surface facing an outside of the wiring board, and a bottom surface extending from a lower end of the side surface toward an end part of the wiring board, the side surface of the step and the side surface of the adhesive are positioned to overlap with one another in a view from a stacking direction of the adhesive and the semiconductor module, and the side surface of the step and the side surface of the adhesive are in direct and physical contact with one another on the upper surface of the wiring board.

2. The semiconductor device according to claim 1, wherein the sealing member is a metal-containing film, and the sealing member includes a drawn part extending outward from a side surface of the sealing member in a view from the stacking direction.

3. The semiconductor device according to claim 2, wherein the wiring board is provided with a ground wire at a predetermined depth, and the drawn part covers the ground wire exposed on the bottom surface of the step.

4. The semiconductor device according to claim 1, wherein a surface roughness of a bottom surface of the step is rougher than the upper surface of the wiring board.

5. The semiconductor device according to claim 1, wherein the semiconductor module includes multiple semiconductor chips stacked in the stacking direction.

6. The semiconductor device according to claim 5, wherein the multiple semiconductor chips each include a semiconductor element provided on a surface of a corresponding one of the multiple semiconductor chips facing the wiring board, the semiconductor element being connected to the wiring board by a wire.

7. The semiconductor device according to claim 5, wherein the multiple semiconductor chips are connected to each other by a through-silicon via.

8. The semiconductor device according to claim 1, wherein the semiconductor module includes a single semiconductor chip.

9. The semiconductor device according to claim 1, wherein the side surface of the step is formed perpendicular to the upper surface of the wiring board.

10. The semiconductor device according to claim 2, wherein the sealing member has two different heights, and the drawn part has a lower height of the two different heights.

11. The semiconductor device according to claim 3, wherein the drawn part is a part of the metal-containing film.

12. The semiconductor device according to claim 3, wherein the side surface of the sealing member is in contact with an insulating layer, which is an upper layer of the ground wire, and a bottom surface of the drawing part included in the sealing member is in contact with the ground wire.

* * * * *